(12) United States Patent
Kang

(10) Patent No.: US 12,526,991 B2
(45) Date of Patent: Jan. 13, 2026

(54) MANUFACTURING METHOD OF NON-VOLATILE MEMORY DEVICE HAVING UNIFORM DIELECTRIC FILM PROFILE

(71) Applicant: SK keyfoundry Inc., Cheongju-si (KR)

(72) Inventor: Yang Beom Kang, Cheongju-si (KR)

(73) Assignee: SK keyfoundry Inc., Cheongju-si (KR)

( * ) Notice: Subject to any disclaimer, the term of this patent is extended or adjusted under 35 U.S.C. 154(b) by 480 days.

(21) Appl. No.: 17/574,908

(22) Filed: Jan. 13, 2022

(65) Prior Publication Data

US 2023/0036029 A1    Feb. 2, 2023

(30) Foreign Application Priority Data

Jul. 27, 2021   (KR) ........................ 10-2021-0098742

(51) Int. Cl.
  *H10B 41/49*   (2023.01)
  *H10D 64/01*   (2025.01)

(52) U.S. Cl.
  CPC ........... *H10B 41/49* (2023.02); *H10D 64/021* (2025.01)

(58) Field of Classification Search
  CPC ............ H01L 29/6656; H01L 29/6682; H10D 64/021; H10B 41/49
  See application file for complete search history.

(56) References Cited

U.S. PATENT DOCUMENTS

| | | | | |
|---|---|---|---|---|
| 4,735,680 A | * | 4/1988 | Yen ..................... | H01L 29/6659 257/E21.038 |
| 2008/0128785 A1 | * | 6/2008 | Park ...................... | H10B 41/48 257/E29.302 |
| 2008/0290427 A1 | * | 11/2008 | Visokay ............ | H01L 21/28097 257/E21.199 |
| 2009/0294877 A1 | * | 12/2009 | Tsutsui .............. | H01L 29/42368 257/E21.177 |

(Continued)

FOREIGN PATENT DOCUMENTS

| | | |
|---|---|---|
| KR | 10-2005-0095429 A | 9/2005 |
| KR | 10-2008-0049517 A | 6/2008 |

(Continued)

OTHER PUBLICATIONS

Mogab, Plasma etching of Si and SiO2-The effect of oxygen additions to CF4 Plasmas, 1978 (Year: 1978).*

*Primary Examiner* — Britt Hanley
*Assistant Examiner* — Casey Paul Boatman
(74) *Attorney, Agent, or Firm* — NSIP Law

(57) ABSTRACT

A manufacturing method of a non-volatile memory device, includes forming a floating gate on a substrate, depositing a first insulating layer on the floating gate, depositing a second insulating layer on the first insulating layer, depositing a third insulating layer on the second insulating layer, performing a first etch-back process on the third insulating layer to form a spacer-shaped third insulating layer on the second insulating layer, performing a second etch-back process on the second insulating layer to form a spacer-shaped second (Continued)

insulating layer on the first insulating layer, and performing a wet etching to remove the spacer-shaped third insulating layer to form a spacer-shaped first insulating layer and the spacer-shaped second insulating layer on the floating gate.

13 Claims, 9 Drawing Sheets

(56) References Cited

U.S. PATENT DOCUMENTS

| | | |
|---|---|---|
| 2012/0003806 A1* | 1/2012 | Wang ................ H10D 64/021 |
| | | 257/E21.409 |
| 2013/0099301 A1* | 4/2013 | Cho ................ H01L 29/42324 |
| | | 257/316 |
| 2014/0197472 A1 | 7/2014 | Chang et al. |
| 2015/0056775 A1 | 2/2015 | Huang et al. |
| 2015/0129953 A1 | 5/2015 | Owada |
| 2016/0093707 A1 | 3/2016 | Ryu et al. |
| 2017/0069640 A1* | 3/2017 | Wu ...................... H01L 29/788 |
| 2021/0028183 A1* | 1/2021 | Kim ...................... H10B 41/10 |

FOREIGN PATENT DOCUMENTS

| | | |
|---|---|---|
| KR | 10-2010-0092666 A | 8/2010 |
| KR | 10-2013-0043025 A | 4/2013 |
| KR | 10-2015-0035394 A | 4/2015 |

* cited by examiner

MANUFACTURING METHOD OF NON-VOLATILE MEMORY DEVICE HAVING UNIFORM DIELECTRIC FILM PROFILE

CROSS-REFERENCE TO RELATED APPLICATION

This application claims the benefit under 35 U.S.C. § 119 to Korean Patent Application No. 10-2021-0098742 filed on Jul. 27, 2021, in the Korean Intellectual Property Office, the entire disclosure of which is incorporated herein by reference for all purposes.

BACKGROUND

1. Field

The following disclosure relates to a manufacturing method of non-volatile memory device having uniform dielectric layer profile.

2. Description of Related Art

A non-volatile memory device includes a floating gate, a control gate, and a dielectric layer between a floating gate and a control gate. Herein, a dielectric layer includes an oxide layer/a nitride layer/an oxide layer, and a pattern shape of a nitride layer is affected by an etching method of a nitride layer. Generally, a wet etching is implemented to etch a nitride layer. A chemical solution like phosphoric acid is implemented in a wet etching, but there is an issue that a concentration of a chemical solution is changed in a chemical bath based on a time. Therefore, an etching speed of a wet etching may be changed according to in-wafer, wafer-to-wafer, or lot-to-lot. Accordingly, a pattern of a nitride layer that remains after a wet etching may be changed. A movement amount of an electron, etc. may be affected by a dielectric layer profile in a non-volatile memory device. Thus, there may be a problem in a read/writing operation of a non-volatile memory device.

SUMMARY

This summary is provided to introduce a selection of concepts in a simplified form that are further described below in the Detailed Description. This summary is not intended to identify key features or essential features of the claimed subject matter, nor is it intended to be implemented as an aid in determining the scope of the claimed subject matter.

In a general aspect, a manufacturing method of a non-volatile memory device, includes forming a floating gate on a substrate, depositing a first insulating layer on the floating gate, depositing a second insulating layer on the first insulating layer, depositing a third insulating layer on the second insulating layer, performing a first etch-back process on the third insulating layer to form a spacer-shaped third insulating layer on the second insulating layer, performing a second etch-back process on the second insulating layer to form a spacer-shaped second insulating layer on the first insulating layer, and performing a wet etching to remove the spacer-shaped third insulating layer to form a spacer-shaped first insulating layer and the spacer-shaped second insulating layer on the floating gate.

The first insulating layer and the third insulating layer may be formed of a material different from a material of the second insulating layer.

The first insulating layer may be different from the second insulating layer.

The first insulating layer and the second insulating layer may be made of silicon oxide and silicon nitride, respectively, and the second insulating layer may have a thickness thicker than a thickness of the first insulating layer.

The first and second etch-back processes may be implemented using first and second etching gases, respectively. The first etching gases may include $CiFj$ and oxygen. The second etching gases may include $CxHyFz$ and oxygen, and the i, j, x, y and z are natural numbers.

The manufacturing method may further include forming a control gate insulating layer on the spacer-shaped second insulating layer, forming a spacer-shaped control gate on the control gate insulating layer, forming a spacer on the spacer-shaped control gate, and forming a source region and a drain region in the substrate. The control gate insulating layer may be in contact with the spacer-shaped first and second insulating layers.

The manufacturing method may further include forming a silicide layer on the source region, the drain region, and the control gate, respectively, and forming a first contact plug and a second contact plug on the source region and the drain region respectively.

A length of the silicide layer formed on the drain region may be less than a length of the drain region.

The manufacturing method may further include forming first and the second lightly doped regions in the substrate. The first and the second lightly doped regions may surround the source region and the drain region, respectively.

The manufacturing method may further include forming a trench isolation in the substrate, forming an N-type deep well region in the substrate, and forming a P-type well region on the N-type deep well region.

In another general aspect, a non-volatile memory device includes a tunneling gate insulating layer, a floating gate, a buffer oxide layer, and a hard mask layer sequentially disposed on a substrate; a spacer-shaped first insulating layer disposed on a sidewall of the floating gate; a spacer-shaped second insulating layer disposed on a sidewall of the spacer-shaped first insulating layer; a control gate insulating layer disposed on the spacer-shaped second insulating layer and the hard mask layer; a spacer-shaped control gate disposed on the control gate insulating layer; a source region and a drain region disposed in the substrate; a silicide layer disposed on each of the control gate, the source region, and the drain region; an etch stop layer disposed on the silicide layer; an inter-layer insulating layer disposed on the etch stop layer; and a contact plug disposed in the inter-layer insulating layer. The control gate insulating layer is in contact with the spacer-shaped first and second insulating layers and the hard mask layer.

The first insulating layer may be different from the second insulating layer, and the second insulating layer may have a thickness thicker than a thickness of the first insulating layer.

A length of the silicide layer formed on the drain region may be less than a length of the drain region.

The non-volatile memory device may further include a spacer disposed to contact a side of the spacer-shaped control gate.

The spacer and the spacer-shaped control gate may have a similar contour.

In another general aspect, a manufacturing method of a non-volatile memory device in accordance with another one or more embodiments of the disclosure may include forming a floating gate, a buffer oxide layer, and a hard mask layer on a substrate; forming a first insulating layer respectively on a side of the floating gate, the buffer oxide layer, and the hard mask layer; forming a second insulating layer on the first insulating layer, which is different material from the first insulating layer; forming a control gate insulating layer on the second insulating layer, which is different material from the second insulating layer; forming a control gate on the control gate insulating layer; forming an LDD spacer on a side of the control gate; forming a source region and a drain region in the substrate; forming a silicide layer respectively on a surface of the control gate, the source region, and the drain region; forming an etch stop layer on the silicide layer; forming an inter-layer insulating layer in the etch stop layer; forming a contact plug to penetrate the inter-layer insulating layer and the etch stop layer; and forming a metal wiring connected to the contact plug, wherein a material of the second insulating layer may be a nitride layer, and it may be formed by a dry etching.

Additionally, a material of the first insulating layer may be an oxide layer, and the second insulating layer may be thicker than the first insulating layer.

Additionally, the dry etching may use a plasma source gas that a CxHyFz gas, in which x, y, z are natural numbers, and an oxygen are mixed.

Additionally, the second insulating layer may not be away from the first insulating layer, in a direction parallel with a surface of the substrate.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
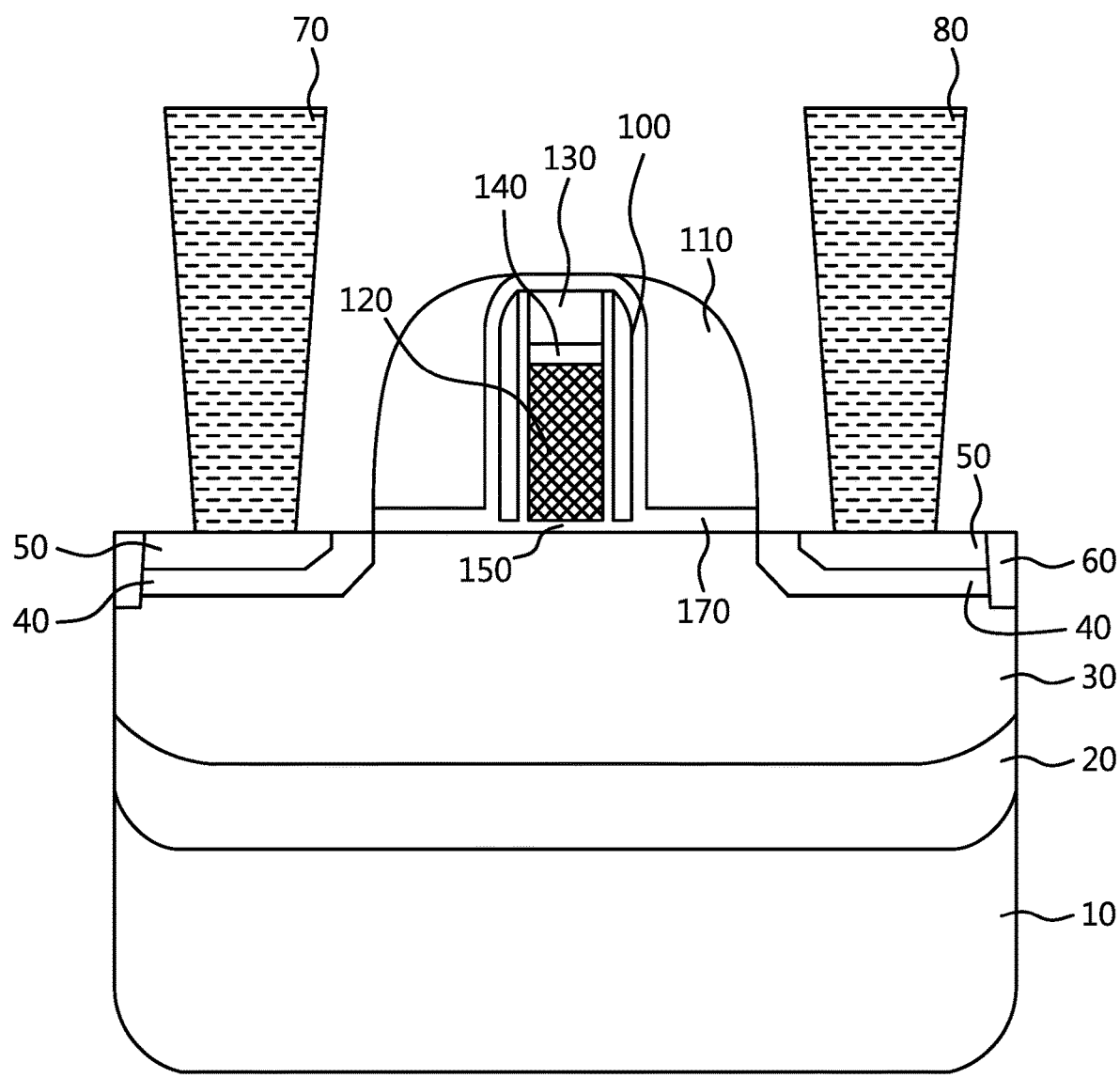
FIG. 1 illustrates an example of an EEPROM (Electrically Erasable Programmable Read-Only Memory Device) device in accordance with one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As implemented herein, the term "and/or" includes any one and any combination of any two or more of the associated listed items.

Although terms such as "first," "second," and "third" may be implemented herein to describe various members, components, regions, layers, or sections, these members, components, regions, layers, or sections are not to be limited by these terms. Rather, these terms are only implemented to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be implemented herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms implemented herein are to be interpreted accordingly.

The terminology implemented herein is for describing various examples only, and is not to be implemented to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The disclosure is to solve the above technical issues and provide a method to improve a profile of a dielectric layer by applying a dry etching method.

A targeted problem of the disclosure is not limited by the problems which are mentioned above, and other problems may be understood by a person skilled in the relevant field of technology, from the following description.

Hereinafter, a detailed description is given below according to the attached drawings.

A description of the disclosure is based on an EEPROM, but it is not limited thereto, and it is possible to be implemented for a non-volatile memory device having a dielectric layer.

FIG. 1 illustrates an example of an EEPROM (Electrically Erasable Programmable Read-Only Memory) device in accordance with one or more embodiments.

An EEPROM device may include a silicon substrate 10 (hereinafter, a substrate), an N-type deep well region 20, a high voltage P-type well region (HPW) 30, a lightly doped region 40, e.g., lightly-doped drain region (LDD), a highly doped N-type region 50, a trench isolation 60, a first contact plug 70, a second contact plug 80, an ONO (oxide/nitride/oxide) dielectric layer 100, a control gate (CG) 110, a floating gate (FG) 120, a hard mask layer 130, a buffer oxide layer 140, a thin gate insulating layer 150, and a control gate insulating layer 170.

A substrate 10 may be doped by P-type dopants. An N-type deep well region 20 may be formed in the substrate 10. A high voltage P-type well region 30 may be formed on the N-type deep well region 20, and it may be electrically isolated from a substrate by the N-type deep well region 20.

Trench isolations 60 may be formed in the high voltage P-type well region 30. A control gate 110, a floating gate 120, a hard mask layer 130, and a buffer oxide layer 140 may be formed on the substrate 10. A polysilicon material may be used for the control gate 110 and the floating gate 120. A silicon nitride layer may be used for a hard mask layer 130.

A first contact plug 70 and a second contact plug 80 may be separately disposed on opposite sides of a control gate 110, and a highly doped N-type region 50 may be disposed under each bottom of the first contact plug 70 and the second contact plug 80. A lightly doped region 40 may be formed surrounding a highly doped N-type region 50.

A floating gate 120 may be disposed on the thin gate insulating layer 150. A buffer oxide layer 140 and a hard mask layer 130 may be disposed, e.g., sequentially, on a top surface of the floating gate 120. The control gate 110 may be disposed on the control gate insulating layer 170. An ONO (oxide/nitride/oxide) dielectric layer 100 may be disposed between the floating gate 120 and the control gate 110.

FIGS. 2 to 9 illustrate examples of methods of forming an EEPROM device in accordance with one or more embodiments.

Figure 2:
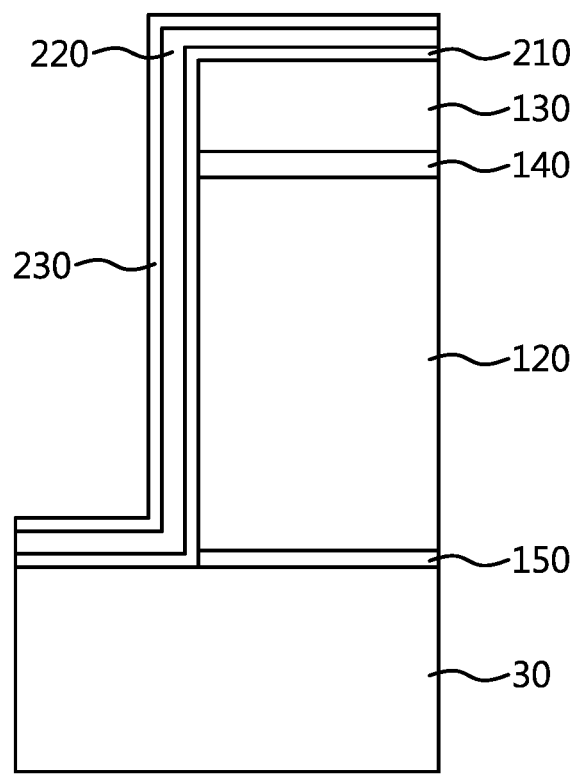
FIGS. 2 to 9 illustrate examples of methods of forming an EEPROM device in accordance with one or more embodiments.

In FIG. 2, a thin gate insulating layer 150, a floating gate 120, a buffer oxide layer 140, and a hard mask layer 130 may be deposited on a top surface of a high voltage P-type well region 30.

A first insulating layer 210, a second insulating layer 220 and a third insulating layer 230 are sequentially deposited on the floating gate 120 and the hard mask layer 130. The first and third insulating layers 210 and 230 may be deposited by a thermal oxidation process or a LPCVD process using TEOS (Tetra Ethyl Ortho Silicate). Each of the first and third insulating layers 210 and 230 may be implemented as a silicon oxide layer. The second insulating layer 220 may be deposited using an LPCVD process. The second insulating layer 220 may be implemented as a silicon nitride layer.

The second insulating layer 220 may have a thickness thicker than that of the first insulating layer 210 or the third insulating layer 230. In a non-limiting example, the thickness of the first insulating layer 210 may be about 5-15 nm, the thickness of the second insulating layer 220 may be about 20-100 nm, and thickness of the third insulating layer 230 may be about 5-10 nm. Thus, the order of thicknesses in the example may be as follows: the second insulating layer 220>the first insulating layer 210 the third insulating layer 230.

Figure 3:
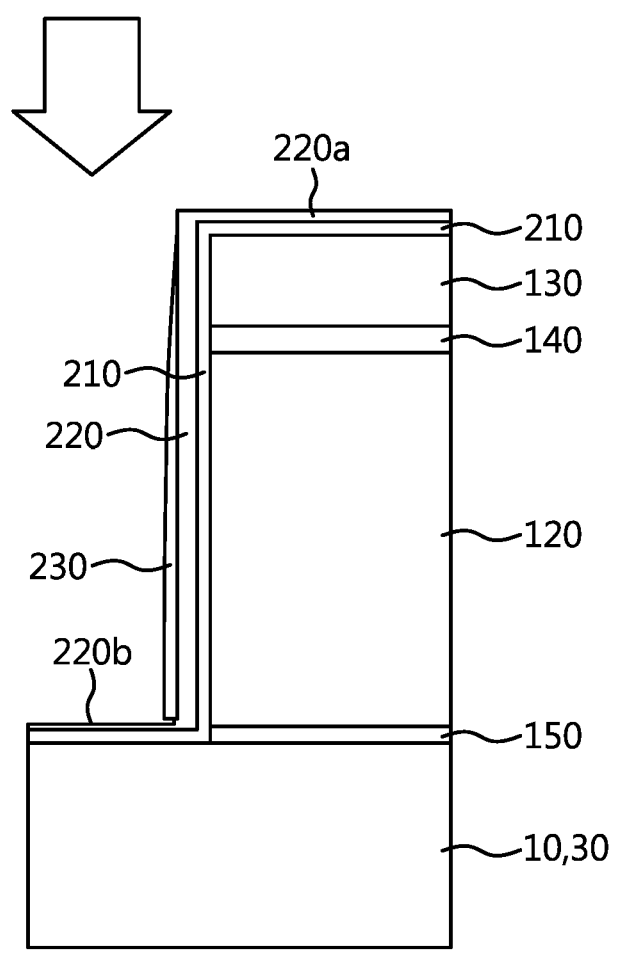

FIG. 3 illustrates an operation of performing a first dry etching process to etch the third insulating layer 230, resulting in a spacer-shaped third insulating layer 230 being disposed on the second insulating layer 220. The first dry etching process may be implemented using a first etch-back process and first plasma source gases. In an example, the first etch-back process may be replaced by a reactive ion etching (RIE) process. The spacer-shaped third insulating layer 230 may refer to the third insulating layer 230 that remains on a sidewall of the second insulating layer 220 after being partially etched by the first dry etching process.

The first plasma source gases may comprise CiFj and oxygen ($O_2$), wherein i and j are natural numbers. $CF_4$ or $C_4F_8$ are implemented for CiFj. During the process of dry etching the third insulating layer 230, the second insulating layer 220 may play a role as an etch stop layer when the second insulating layer 220 is made of a material different from the material of the third insulating layer 230, for example.

After performing the first dry etching process, the second insulating layer 220 may be partially etched, which may result in exposing a first partially etched second insulating layer 220a and a second partially etched second insulating layer 220b. Each thickness of the first partially etched second insulating layer 220a and the second partially etched second insulating layer 220b may become thinner than that of the as-deposited second insulating layer 220 (See FIG. 2). The first partially etched second insulating layer 220a and the second partially etched second insulating layer 220b, as well as as-deposited second insulating layer 220, remain on the first insulating layer 210.

Figure 4:
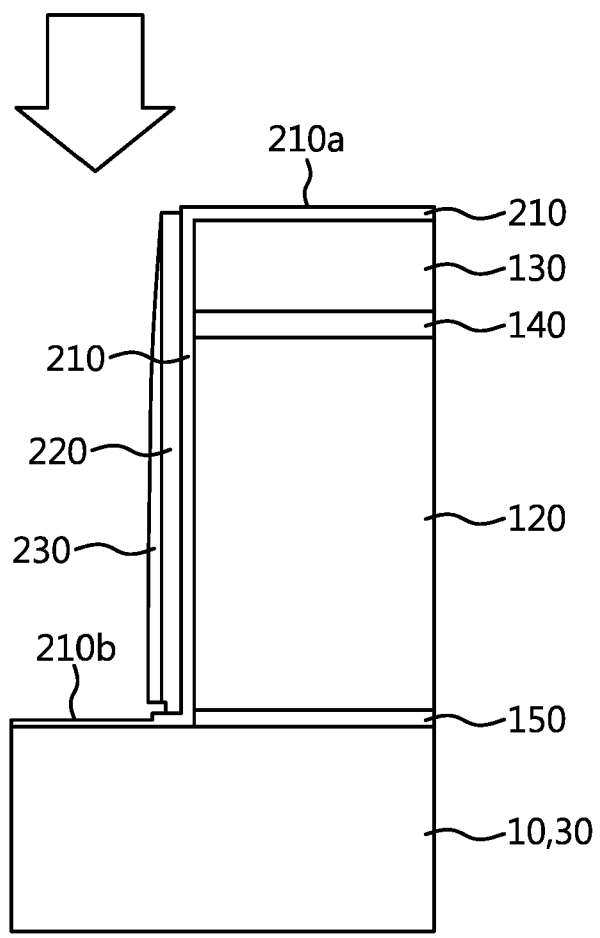

FIG. 4 illustrates an operation performing a second dry etching process to remove the first partially etched second insulating layer 220a and the second partially etched second insulating layer 220b, which results in a spacer-shaped second insulating layer 220 being disposed on the first insulating layer 210. The second dry etching process may be implemented by a second etch-back process and second plasma source gases, for example. The first partially etched second insulating layer 220a and the second partially etched second insulating layer 220b are all removed through the second dry etching process. The spacer-shaped second insulating layer 220 may refer to the second insulating layer 220 that remains on a sidewall of the first insulating layer 210 after being partially etched by the second dry etching process. As shown in FIG. 4, the spacer-shaped second insulating layer 220 may have a rectangular shape.

The second plasma source gases may comprise CxHyFz and oxygen ($O_2$), wherein x, y and z are natural numbers. In a non-limiting example, CxHyFz may be implemented as $CHF_3$. Additionally, during the second dry etching process, in an example, the chamber pressure may be 10-900 mTorr. In the second dry etching, the first insulating layer 210 may play a role as an etch stop layer.

After performing the second dry etching process, the first insulating layer 210 may be partially etched, resulting in a first partially etched first insulating layer 210a and a second partially etched first insulating layer 210b remaining on the hard mask layer 130 and the P-type well region 30, respectively. Each thickness of the first partially etched first insulating layer 210a and the second partially etched first insulating layer 210b may become thinner than that of the as-deposited first insulating layer 210 (See FIG. 3).

With reference to FIG. 4, the spacer-shaped third insulating layer 230 and a spacer-shaped second insulating layer 220 may remain on a side of a floating gate 120 even after the second dry etching process. The second dry etching process induces a uniform thickness profile of the second insulating layer 220 on the wafer, as well as wafer-to-wafer, in-wafer or lot-to-lot.

A wet etching may be implemented to remove the second insulating layer 220, which is a silicon nitride layer, instead of the dry etching process. A wet etching process generally uses a chemical solution, such as phosphoric acid. The concentration of the chemical solution may be changed with a wet etching processing time in a chemical bath. Therefore, a chemical etching speed may be changed from wafer-to-wafer, or lot-to-lot, when the wet etching process is implemented to remove the second insulating layer 220. The remaining second insulating layer 220 may have various thicknesses on the wafer. In order to uniformly etch the second insulating layer 220, a dry etching process may be implemented rather than the wet etching, when the second insulating layer 220 is a silicon nitride layer.

As shown in FIG. 4, the first partially etched first insulating layer 210a and the second partially etched first insulating layer 210b may remain even after the second dry etching. Therefore, a top surface of a substrate 10 may be protected during a second dry etching due to the first partially etched first insulating layer 210a and the second partially etched first insulating layer 210b.

Figure 5:
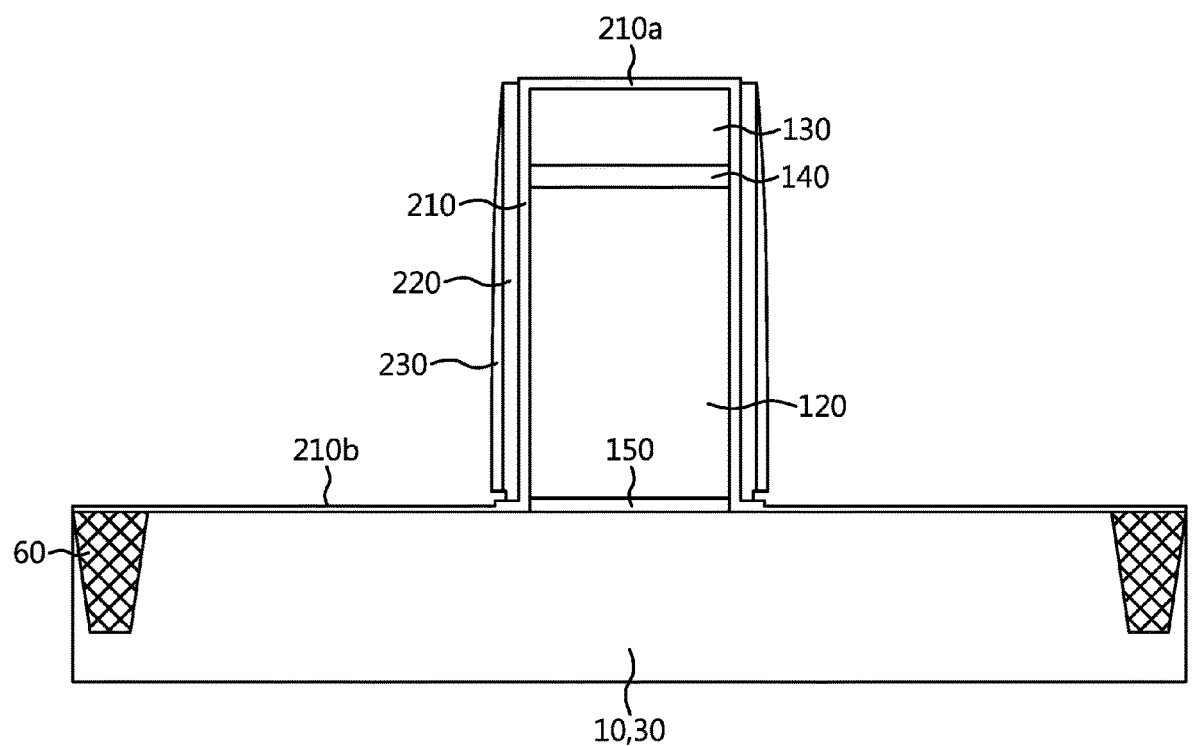

FIG. 5 illustrates an example of a schematic diagram of the semiconductor device after the first and second dry etching processes. The remaining insulating layers 210-230, as shown in FIG. 5, are the same as FIG. 4.

Figure 6:
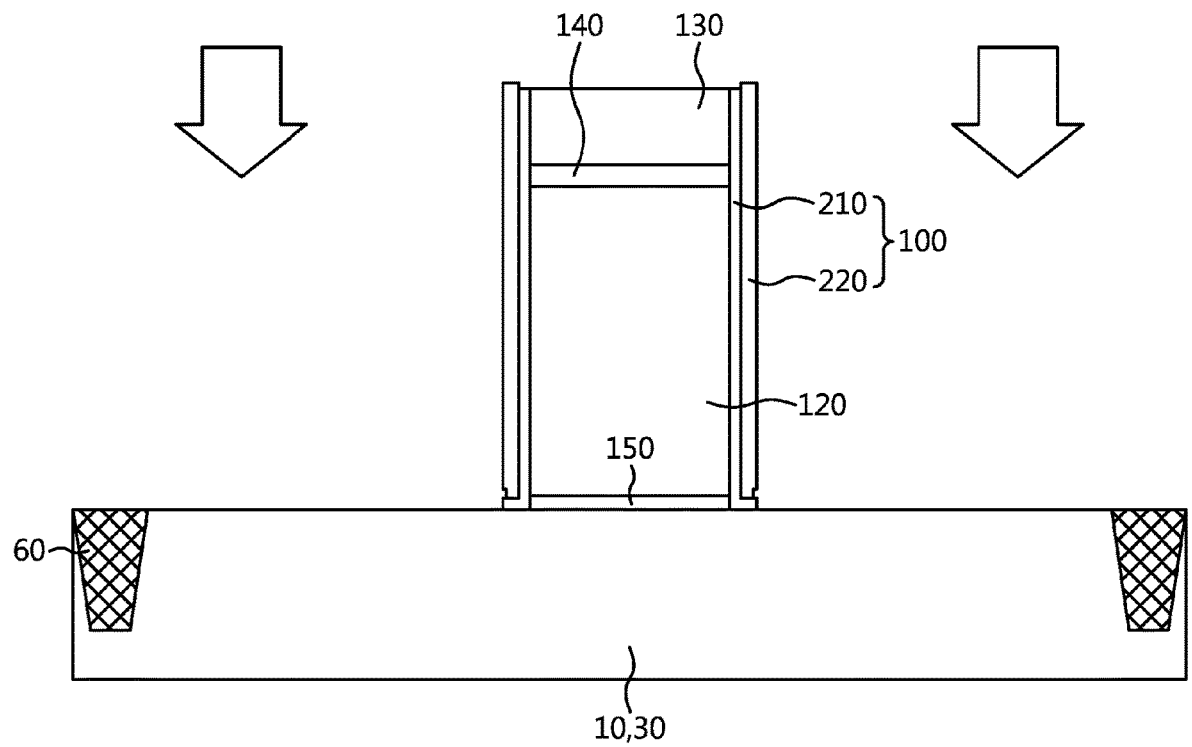

FIG. 6 illustrates an example of performing a wet etching process to remove the spacer-shaped third insulating layer 230, such that a spacer-shaped first insulating layer is formed on sidewalls of the floating gate. A diluted HF (DHF) solution is implemented for the wet etching process. The first partially etched first insulating layer 210a and the second partially etched first insulating layer 210b are also easily removed during the wet etching process, however, the spacer-shaped second insulating layer 220 is-still remains. Since the spacer-shaped third insulating layer 230 and the first partially etched first insulating layer 210a and the second partially etched first insulating layer 210b are all silicon oxide layers, the diluted HF solution may easily remove the layers. Since the spacer-shaped second insulating layer 220 is made of silicon nitride material, it is resistant to be etched by the diluted HF solution. Therefore, a hard mask layer 130 and a surface of a substrate 10 may be exposed. The spacer-shaped first insulating layer 210 may refer to the first insulating layer 210 that remains on a sidewall of the floating gate 120 and under the spacer-shaped second insulating layer 220 after being partially etched by the wet etching process. As shown in FIG. 6. the spacer-shaped first insulating layer 210 may have an L-shape, such that the spacer-shaped first insulating layer 210 is in direct vertical and horizontal contact with the spacer-shaped second insulating layer 220.

The spacer-shaped first and second insulating layer 210 and 220 may remain on both sidewalls of the floating gate 120. The spacer-shaped second insulating layer 220 may remain on the spacer-shaped first insulating layer 210. One end of spacer-shaped second insulating layer 220 is formed inside one end of the spacer-shaped first insulating layer 210. A dielectric layer 100 may comprise the spacer-shaped first and second insulating layers 210 and 220 which are respectively made of silicon oxide and silicon nitride.

Figure 7:
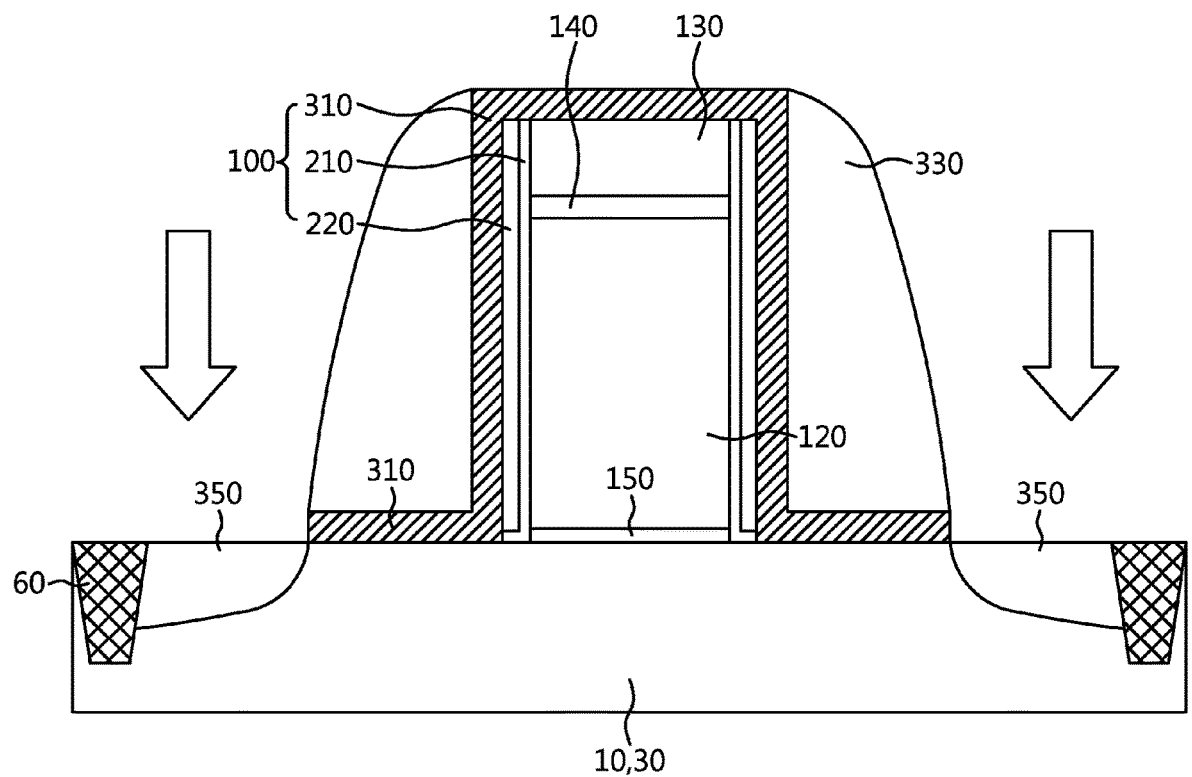

FIG. 7 illustrates an example of forming a control gate insulating layer and a control gate of an EEPROM device in accordance with one or more embodiments.

With reference to FIG. 7, a control gate insulating layer 310 may be formed on the spacer-shaped first insulating layer 210, the spacer-shaped second insulating layer 220, a hard mask layer 130 and a surface of a substrate 10. The control gate insulating layer 310 is direct in contact with the spacer-shaped first and second insulating layers 210 and 220 and the hard mask layer 130. The control gate insulating layer 310 has a thickness greater than that of the spacer-shaped first or second insulating layers 210 or 220. A dielectric layer 100 may comprise the spacer-shaped first and second insulating layers 210 and 220, and a control gate insulating layer 310. The dielectric layer 100 may be disposed between a control gate 330 and a floating gate 120. The spacer-shaped first insulating layer 210 and a control gate insulating layer 310 are all made of a silicon oxide, however, the spacer-shaped second insulating layer 220 is made of a silicon nitride.

A spacer-shaped control gate 330 may be formed on the control gate insulating layer 310, and it may surround a floating gate 120. The spacer-shaped control gate 330 may refer to a control gate 330 that remains on a sidewall of the control gate insulating layer 310 formed on the spacer-shaped first and second insulating layers 210 and 220 after being partially etched by an etching process. As shown in FIG. 7, the spacer-shaped control gate 330 may be in direct vertical and horizontal contact with the control gate insulating layer 310. After forming a control gate 330, an LDD region 350, which is a lightly doped region, may be formed by performing an ion implantation. An LDD region 350 may be formed with arranging a side of a control gate 330. An LDD region 350, which is a lightly doped region, may be formed as an N-type. An LDD region 350 may have an opposite conductivity type from the P- type well region 30.

Figure 8:
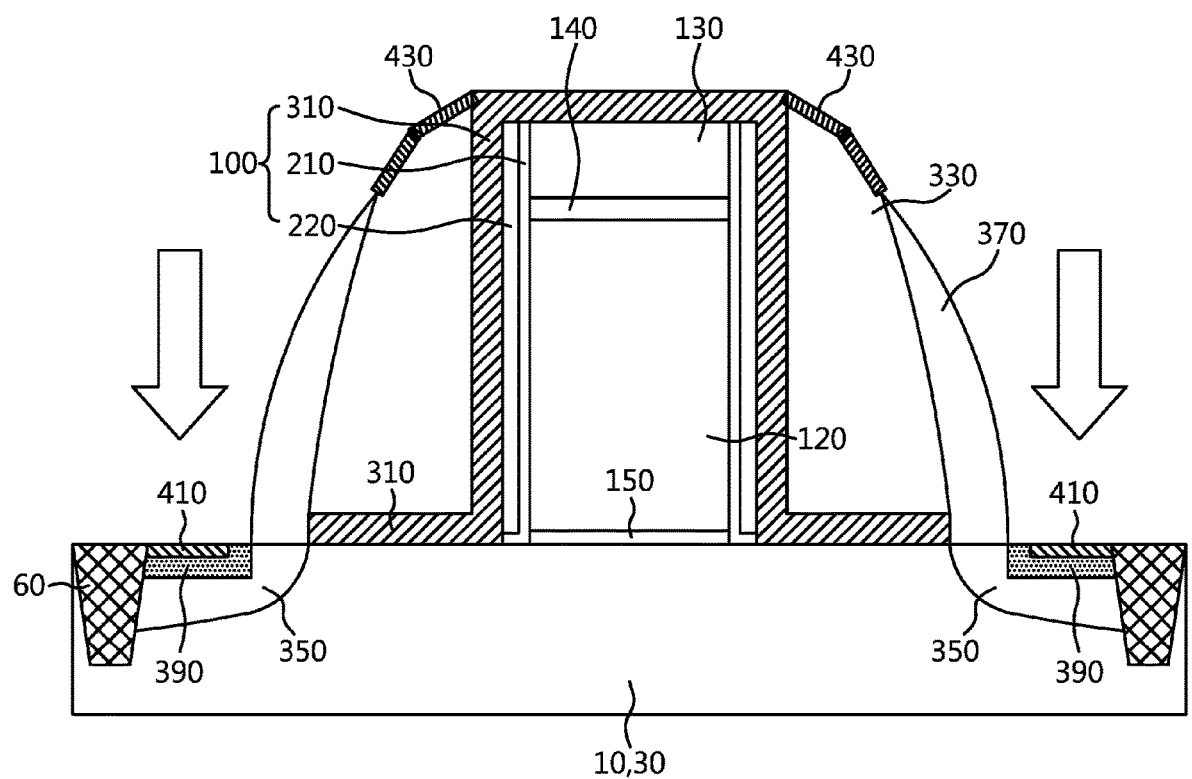

FIG. 8 illustrates an example of forming an LDD spacer, a source/drain region, and a silicide layer of an EEPROM device in accordance with one or more embodiments.

With reference to FIG. 8, an LDD spacer 370 may be formed on a side of a control gate 330. An LDD spacer 370 may be a spacer formed with an oxide layer/a nitride layer. With depositing an oxide layer/a nitride layer successively through a LPCVD method, it may be etched using an etch-back process. Then, it is formed as a spacer.

After forming an LDD spacer 370, a source/drain region 390, which are highly doped regions, may be formed. A source/drain region 390 (a highly doped region) may be formed as an N-type. After forming a source/drain region 390 (a highly doped region), a silicide layer 410, 430 may be formed on a surface of a substrate and a control gate 330. Since an LDD spacer 370 is formed on partial surface of a control gate 330, a silicide layer 430 may be formed on the rest area.

A silicide layer 410 formed on a surface of a substrate 10 may be formed only on a partial area of a source/drain region (a highly doped region) 390, and not the entire area of the source/drain region 390. A length of a silicide layer 410 may be shorter than a length of a source/drain region (a highly doped region) 390. It is to reduce a leakage current in a turn-off state.

Figure 9:
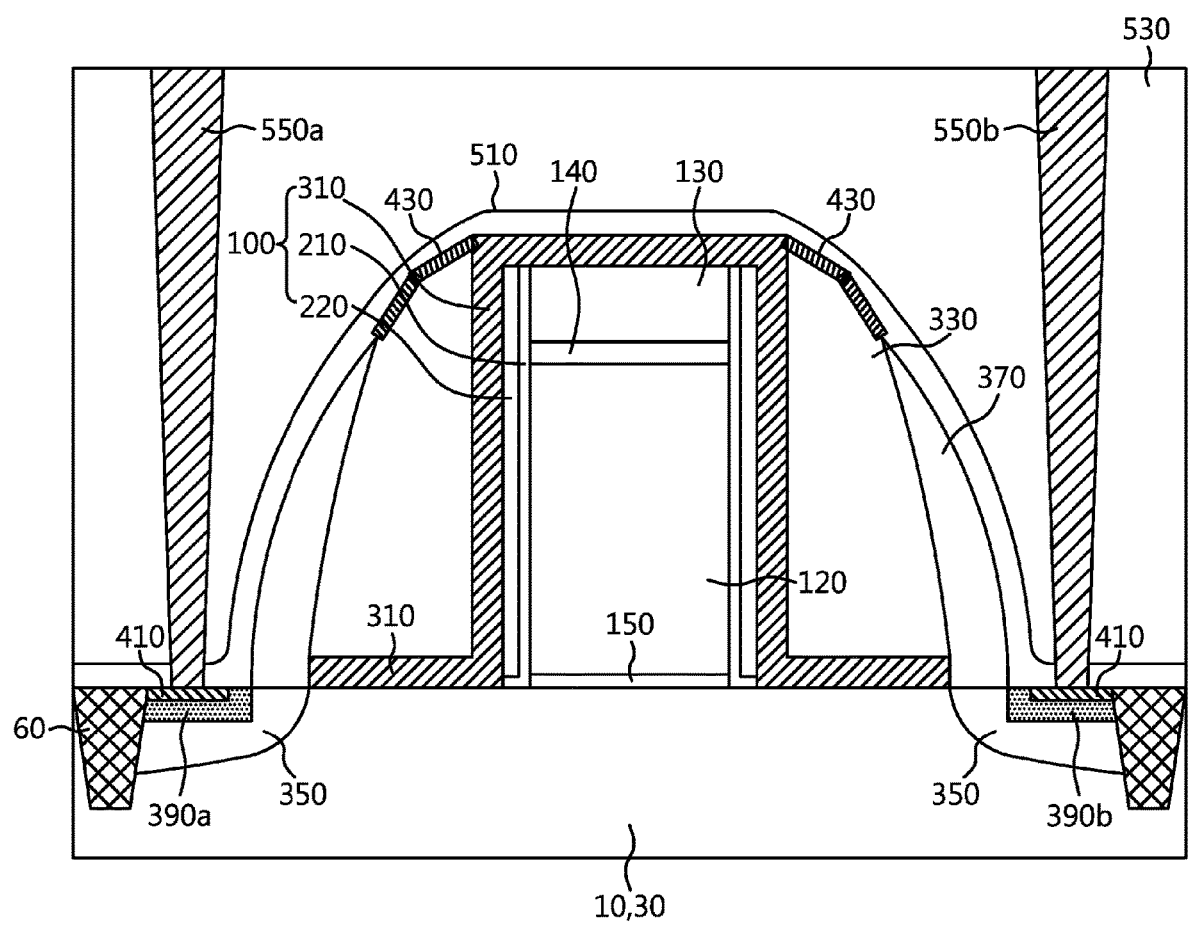

FIG. 9 illustrates an example of forming a contact plug of an EEPROM device in accordance with one or more embodiments.

With reference to FIG. 9, an etch stop layer 510 and an inter-layer insulating layer 530 may be deposited on the entire substrate 10. The etch stop layer 510 may be desired for a borderless contact process. By etching an inter-layer insulating layer 530 and an etch stop layer 510, a contact plug 550 may be formed on a silicide layer 410 that is formed on a surface of a substrate 10. A contact plug 550 may be implemented as a second contact plug or a first contact plug respectively. A left contact plug 550 may be implemented as a first contact plug, and a right contact plug 550 may be implemented as a second contact plug, or vice versa. A first contact plug 550a and a second contact plug 550b are connected to a source region 390a and a drain region 390b, respectively. Therefore, it may be said that the first contact plug 550a and the second contact plug 550b are formed by etching the etch stop layer 510 and the inter-layer insulating layer 530.

A non-volatile memory device according to one or more embodiments of the disclosure may form a uniform structure by forming a dielectric layer with using a dry etching method.

Additionally, by using a dry etching method, an occurrence of a foot may be fundamentally prevented from occurring in the etching of a nitride layer when forming a dielectric layer.

Additionally, by using a dry etching method, a profile of a nitride layer may be precisely controlled.

Additionally, without separating a channel region of a floating gate and a control gate, by forming an ion implantation region for adjusting a program threshold voltage, reliability and retention of a non-volatile memory device may be improved, resulting in a degradation improvement.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A manufacturing method of a non-volatile memory device, comprising:
   forming a floating gate on a substrate;
   forming a hard mask layer on the floating gate;
   depositing a first insulating layer on the floating gate and on the substrate;
   depositing a second insulating layer on the first insulating layer;
   depositing a third insulating layer on the second insulating layer;
   performing a first etch-back process on the third insulating layer to form a spacer-shaped third insulating layer on a sidewall of the second insulating layer;
   performing a second etch-back process on the second insulating layer to form a spacer-shaped second insulating layer on a sidewall of the first insulating layer;
   performing a wet etching to remove the spacer-shaped third insulating layer to form a spacer-shaped first insulating layer on a sidewall of the floating gate and the spacer-shaped second insulating layer on the spacer-shaped first insulating layer;
   forming a control gate insulating layer on the spacer-shaped first and second insulating layers, the hard mask layer and the substrate, such that the control gate insulating layer is in direct contact with each upper surface of the hard mask layer and the substrate, and upper and side surfaces of the spacer-shaped first and second insulating layers;
   forming a spacer-shaped control gate on the control gate insulating layer;
   forming a spacer on the spacer-shaped control gate;
   forming a source region and a drain region adjacent to the spacer;
   forming a silicide layer on the spacer-shaped control gate;
   forming an etch stop layer on the silicide layer, the source region, and the drain region, such that the etch stop layer is in direct contact with the silicide layer and the spacer; and
   forming a first contact plug and a second contact plug through the etch stop layer on the source region and the drain region, respectively,
   wherein the spacer-shaped first insulating layer has an L-shape which is in direct contact with the spacer-shaped second insulating layer in a horizontal direction and a vertical direction.

2. The manufacturing method of claim 1, wherein the first insulating layer and the third insulating layer are formed of a material different from a material of the second insulating layer.

3. The manufacturing method of claim 1,
   wherein the first insulating layer is different from the second insulating layer.

4. The manufacturing method of claim 1, wherein the first insulating layer and the second insulating layer are made of silicon oxide and silicon nitride, respectively, and
   wherein the second insulating layer has a thickness thicker than a thickness of the first insulating layer.

5. The manufacturing method of claim 1, wherein the first and second etch-back processes are implemented using first and second etching gases, respectively,
   wherein the first etching gases comprise $CiFj$ and oxygen,
   wherein the second etching gases comprise $CxHyFz$ and oxygen, and
   wherein the i, j, x, y and z are natural numbers.

6. The manufacturing method of claim 1, wherein a length of the silicide layer formed on the drain region is less than a length of the drain region.

7. A manufacturing method of a non-volatile memory device, the method comprising:
   forming a tunneling gate insulating layer on a substrate;
   forming a floating gate on the tunneling gate insulating layer;
   forming a hard mask layer on the floating gate;
   forming a first insulating layer having an L-shape on a sidewall of the floating gate and on the substrate;
   forming a second insulating layer having a rectangular shape on the first insulating layer;

forming a control gate insulating layer on the first and second insulating layers, the hard mask layer and the substrate, such that the control gate insulating layer is in direct contact with each upper surface of the hard mask layer and the substrate, and upper and side surfaces of the spacer-shaped first and second insulating layers;

forming a control gate having a curved surface away from the floating gate on the control gate insulating layer;

forming a spacer on the control gate;

forming a source region and a drain region in the substrate;

forming a silicide layer on the control gate;

forming an etch stop layer on the silicide layer, the source region, and the drain region, such that the etch stop layer is in direct contact with the silicide layer and the spacer; and forming a first contact plug and a second contact plug through the etch stop layer on the source region and the drain region, respectively, wherein the first insulating layer has an L-shape which is in direct contact with the second insulating layer in a horizontal direction and a vertical direction.

8. The manufacturing method of claim 7, wherein the first insulating layer is formed of a material different from a material of the second insulating layer.

9. The manufacturing method of claim 7, wherein the control gate insulating layer has a thickness greater than a thickness of the first insulating layer.

10. The manufacturing method of claim 7, wherein the hard mask layer comprises a silicon nitride layer.

11. The manufacturing method of claim 7, wherein the first insulating layer comprises a side surface, a bottom surface, and a top surface, and wherein the side surface and the top surface of the first insulating layer are in direct contact with the control gate insulating layer, and the bottom surface of the first insulating layer is in direct contact with the substrate.

12. A manufacturing method of a non-volatile memory device, the method comprising:

forming a tunneling gate insulating layer on a substrate;

forming a floating gate on the tunneling gate insulating layer;

forming a hard mask layer on the floating gate;

forming a first insulating layer having an L-shape on a sidewall of the floating gate and on the substrate;

forming a second insulating layer having a rectangular shape on the first insulating layer;

forming a control gate insulating layer on the first and second insulating layers, the hard mask layer and the substrate, such that the control gate insulating layer is in direct contact with each upper surface of the hard mask layer and the substrate, and upper and side surfaces of the first and second insulating layers; and forming a control gate having a curved surface away from the floating gate on the control gate insulating layer;

forming a spacer on the control gate;

forming a source region and a drain region adjacent to the spacer;

forming a silicide layer on the control gate; and forming an etch stop layer on the silicide layer, the source region, and the drain region, such that the etch stop layer is in direct contact with the silicide layer and the spacer; and forming a first contact plug and a second contact plug through the etch stop layer on the source region and the drain region, respectively, wherein the first insulating layer has an L-shape which is in direct contact with the second insulating layer in a horizontal direction and a vertical direction.

13. The manufacturing method of claim 12, wherein the first insulating layer comprises a side surface, a bottom surface, and a top surface, and wherein the side surface and the top surface of the first insulating layer are in direct contact with the control gate insulating layer, and the bottom surface of the first insulating layer is in direct contact with the substrate.

\* \* \* \* \*